United States Patent
Kimura et al.

(10) Patent No.: US 6,734,606 B2
(45) Date of Patent: May 11, 2004

(54) PIEZOELECTRIC CERAMIC COMPOSITION AND PIEZOELECTRIC CERAMIC ELEMENT USING THE SAME

(75) Inventors: Masahiko Kimura, Kusatsu (JP); Hirozumi Ogawa, Shiga-ken (JP); Takuya Sawada, Lausanne (CH); Akira Ando, Omihachiman (JP)

(73) Assignee: Murata Manufacturing Co., Ltd (JP)

(*) Notice: Subject to any disclaimer, the term of this patent is extended or adjusted under 35 U.S.C. 154(b) by 0 days.

(21) Appl. No.: 10/300,584

(22) Filed: Nov. 21, 2002

(65) Prior Publication Data

US 2003/0117043 A1 Jun. 26, 2003

(30) Foreign Application Priority Data

Dec. 14, 2001 (JP) ........................ 2001-382163

(51) Int. Cl.$^7$ ..................... H01L 41/187; C04B 35/475
(52) U.S. Cl. .................... 310/358; 310/320; 310/368
(58) Field of Search ................... 310/320, 358, 310/368

(56) References Cited

U.S. PATENT DOCUMENTS

| | | | |
|---|---|---|---|
| 6,231,779 B1 | * 5/2001 | Chiang et al. | 252/62.9 R |
| 6,258,459 B1 | * 7/2001 | Noguchi et al. | 428/446 |
| 6,488,864 B2 | * 12/2002 | Kimura et al. | 252/62.9 R |
| 6,548,941 B2 | * 4/2003 | Sawada et al. | 310/363 |

FOREIGN PATENT DOCUMENTS

| | | | |
|---|---|---|---|
| EP | 1178025 A2 | * 6/2002 | C04B/35/475 |
| JP | 8-290964 | * 11/1996 | C01B/13/32 |
| JP | 2001-328866 | 11/2001 | C04B/35/495 |
| JP | 2002-173369 | * 6/2002 | C04B/35/46 |

* cited by examiner

Primary Examiner—Thomas M. Dougherty
(74) Attorney, Agent, or Firm—Dickstein, Shapiro, Morin & Oshinsky, LLP.

(57) ABSTRACT

A piezoelectric ceramic composition includes a bismuth layered compound containing Sr, Bi, Nb and a metal element other than Bi having a valence of 3. The bismuth layered compound satisfies the relational expressions: $0.275<a/c<0.5$; $0.9 \leq b/c \leq 1$; $0<x/c \leq 0.175$; and $0.5<(a+3x/2)/c \leq 0.7$, where $a$, $b$, $c$ and $x$ represent the molar fractions of Sr, Bi, Nb, and the metal element other than Bi having a valence of 3, respectively. Thus, a piezoelectric ceramic composition mainly containing a bismuth layered compound whose bismuth content is equal to or less than the stoichiometric value and not substantially containing lead and which can be advantageously used for piezoelectric ceramic elements exhibiting a $Q_{max}$-factor sufficient for practical use can be achieved.

21 Claims, 2 Drawing Sheets

PIEZOELECTRIC CERAMIC COMPOSITION AND PIEZOELECTRIC CERAMIC ELEMENT USING THE SAME

BACKGROUND OF THE INVENTION

1. Field of the Invention

The present invention relates to piezoelectric ceramic compositions and piezoelectric ceramic elements using the same, and particularly to a piezoelectric ceramic composition advantageously used for piezoelectric ceramic elements, such as piezoelectric ceramic filters, resonators, and oscillators, and to a piezoelectric ceramic element using the piezoelectric ceramic composition.

2. Description of the Related Art

In general, a piezoelectric ceramic composition used for piezoelectric ceramic elements, such as piezoelectric ceramic filters, oscillators and resonators, has substantially been composed of lead titanate zirconate ($Pb(Ti_xZr_{1-x})O_3$) or lead titanate ($PbTiO_3$). However, such a piezoelectric ceramic composition contains a large amount of lead whose oxides vaporize during the manufacturing processes, and consequently, degrade the uniformity of the products. In order to prevent the uniformity from being degraded due to the vaporization of lead oxides, it is preferable that the piezoelectric ceramic composition contains substantially no lead.

In contrast, a piezoelectric ceramic composition substantially composed of a bismuth layered compound, such as $SrBi_2Nb_2O_9$, does not cause the problem described above because it does not contain lead oxides.

However, the materials used in piezoelectric ceramic elements, particularly piezoelectric oscillators, are generally desired to have a high maximum value, $Q_{max}$-factor, of the electrical quality factor Q ($1/\tan \delta$) in the frequency band, that is, between the resonant frequency and the anti-resonant frequency. A piezoelectric ceramic composition substantially composed of a bismuth layered compound does not exhibit a $Q_{max}$-factor which is sufficient for practical use.

Accordingly, the inventors of the present invention disclosed a piezoelectric ceramic composition in Japanese Unexamined Patent Application Publication No. 2001-328866. Specifically, this piezoelectric ceramic composition is substantially composed of a bismuth layered compound containing Sr, Bi, Nb and O, and the bismuth layered compound satisfies the relational expressions $0.275 \leq a/c \leq 0.5$ and $4 \leq (2a+3b)/c \leq 4.5$, wherein a, b, and c are the molar fractions of Sr, Bi and Nb, respectively. This composition does not contain lead and has an increased $Q_{max}$-factor. Thus, it is useful as a material of piezoelectric ceramic elements exhibiting a $Q_{max}$-factor sufficient for practical use.

However, it has been found that Bi vaporizes from the piezoelectric ceramic composition during the manufacturing process, such as a firing process, although the amount of vaporization is smaller than that of the vaporization of lead. This is because the bismuth content in the bismuth layered compound, such as $SrBi_2Nb_2O_9$, is higher than the value derived from the stoichiometry, that is, the molar fractions b and c of Bi and Nb of the bismuth layered compound are expressed by $b/c \geq 1$. As a result, the composition ratio is varied and, thus, the desired characteristics are not obtained, occasionally. An expensive sagger or the like is, therefore, required for the firing process. From the viewpoint of reducing manufacturing costs, it is desired to use a ceramic composition leading to characteristics as close to target characteristics as possible without using an expensive sagger. Preferably, the bismuth content is substantially equal to or less than the stoichiometric value.

SUMMARY OF THE INVENTION

Accordingly, an object of the present invention is to provide a piezoelectric ceramic composition mainly containing a bismuth layered compound whose bismuth content is equal to or less than the stoichiometric value and not substantially containing lead and which can be advantageously used for piezoelectric ceramic elements exhibiting a $Q_{max}$-factor sufficient for practical use, and to provide a piezoelectric ceramic element using the piezoelectric ceramic composition.

The present invention is directed to a piezoelectric ceramic composition comprising a bismuth layered compound containing Sr, Bi, Nb, and a metal element other than Bi having a valence of 3. The bismuth layered compound satisfies the relational expressions: $0.275 < a/c < 0.5$; $0.9 \leq b/c \leq 1$; $0 < x/c \leq 0.175$; and $0.5 < (a+3x/2)/c \leq 0.7$, wherein a, b, c and x represent the molar fractions of Sr, Bi, Nb, and the metal element other than Bi having a valence of 3, respectively.

Preferably, the metal element other than Bi having a valence of 3 is at least one selected from the group consisting of Sc, Y, La, Ce, Pr, Nd, Sm, Gd, Dy, Er and Yb.

The piezoelectric ceramic composition may further comprise less than about 0.25 mol of Ta relative to 1 mol of the Nb contained in the bismuth layered compound.

The piezoelectric ceramic composition may further comprise Mn in an amount equivalent to about 1.5 percent by weight or less calculated as $MnCO_3$ and based on the weight of the bismuth layered compound.

The present invention is also directed to a piezoelectric ceramic element including a piezoelectric ceramic formed of the piezoelectric ceramic composition and an electrode disposed on the piezoelectric ceramic By setting the composition ratio of the bismuth layered compound so as to satisfy the relational expressions: $0.275 < a/c < 0.5$; $0.9 \leq b/c \leq 1$; $0 < x/c \leq 0.175$; and $0.5 < (a+3x/2)/c \leq 0.7$, a $Q_{max}$-factor sufficient for practical use can be obtained.

Also, by setting the composition ratio of the bismuth layered compound so as to satisfy the relationship $b/c \leq 1$, variation of the composition ratio resulting from vaporization of Bi in manufacturing processes, such as a firing process, can be prevented, and thus, desired characteristics can be obtained.

When the metal element other than Bi having a valence of 3 is at least one selected from the group consisting of Sc, Y, La, Ce, Pr, Nd, Sm, Gd, Dy, Er and Yb, the piezoelectric ceramic composition has a remarkable effect.

In particular, when the metal element other than Bi having a valence of 3 is Nd, the piezoelectric ceramic composition has a more remarkable effect.

Also, by adding less than about 0.25 mol of Ta relative to 1 mol of the Nb contained in the bismuth layered compound, the piezoelectric ceramic compound can have still more remarkable effect. However, more than about 0.25 mol of Ta reduces the $Q_{max}$-factor in comparison with when Ta is not added, and there is no point in adding an excessive amount of Ta.

Also, by adding Mn in an amount equivalent to about 1.5 percent by weight or less as $MnCO_3$, the piezoelectric ceramic compound can have further remarkable effect. However, more than about 1.5 percent by weight of Mn reduces the $Q_{max}$-factor in comparison with when Mn is not added, and there is no point in adding an excessive amount of Mn.

The above and other objects, features, and advantages of the present invention will no doubt become clear and apparent from the following detailed description of preferred embodiments.

DESCRIPTION OF THE PREFERRED EMBODIMENTS

EXAMPLE

Figure 1:
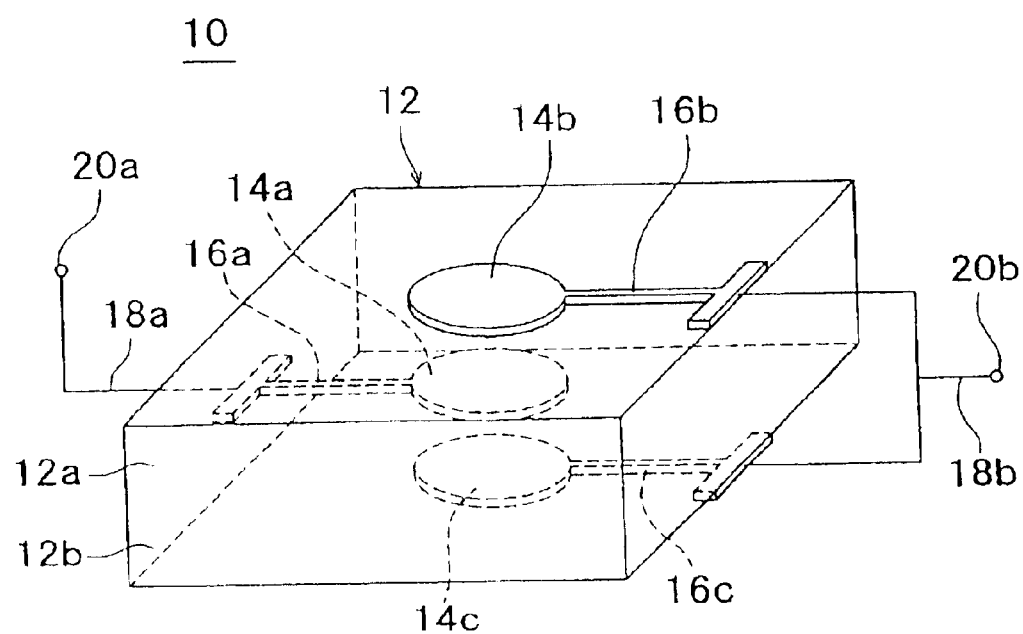
FIG. 1 is a perspective view of a piezoelectric ceramic resonator according to the present invention.

First, starting materials $SrCO_3$, $Bi_2O_3$, $Nb_2O_5$, $La_2O_3$, $Nd_2O_3$, $Y_2O_3$, $Ta_2O_5$ and $MnCO_3$ were weighed so as to satisfy the composition formula: $Sr_aBi_bNb_cMe_xO_9$+y mol Ta+z% by weight $MnCO_3$, wherein Me represents Nd, La or Y; and a, b, c, x and y are shown in Table 1. These materials were wet-blended for 4 hours with a ball mill, thus resulting in a mixture. The mixture was dried and subsequently calcined at 700 to 900° C. After being pulverized, the calcined product was wet-pulverized for 4 hours in the presence of an adequate amount of organic binder using a ball mill, and was subsequently sifted through a 40-mesh sieve to control the particle size. Next, the product was molded at a pressure of 1000 kg/cm² to form a circular plate having a diameter of 12.5 mm and a thickness of 2 mm, and was then fired at a temperature of 1100 to 1250° C. in the atmosphere, thus resulting in a circular ceramic plate. After a silver paste was deposited onto both surfaces of the ceramic plate to form silver electrodes, the ceramic plate was subjected to polarization by applying thereto a direct current of 5 to 10 kV/mm for 10 to 30 minutes in an insulative oil whose temperature was 150 to 200° C. Thus, a piezoelectric ceramic sample was obtained.

The resulting sample, which is a circular resonator, was subjected to the measurement of the $Q_{max}$-factor in a fundamental wave of thickness extensional vibration. The results are shown in Table 1. Table 1 also shows firing temperatures at which the highest $Q_{max}$-factors were exhibited.

TABLE 1

| Sample No. | a | b | c | Me | x | y | z | $Q_{max}$ | Firing Temperature (° C.) |
|---|---|---|---|---|---|---|---|---|---|
| 1* | 1.0 | 2.0 | 2.0 | — | 0 | 0 | 0 | 9.5 | 1250 |
| 2* | 0.9 | 2.0 | 2.0 | — | 0 | 0 | 0 | 8.8 | 1250 |
| 3* | 0.5 | 2.0 | 2.0 | Nd | 0.1 | 0 | 0 | 6.5 | 1200 |
| 4* | 0.8 | 2.0 | 2.0 | Nd | 0.1 | 0 | 0 | 9.0 | 1200 |
| 5 | 0.9 | 2.0 | 2.0 | Nd | 0.1 | 0 | 0 | 14.6 | 1200 |
| 6 | 0.95 | 2.0 | 2.0 | Nd | 0.1 | 0 | 0 | 16.2 | 1200 |
| 7* | 1.0 | 2.0 | 2.0 | Nd | 0.1 | 0 | 0 | 9.8 | 1200 |
| 8* | 0.5 | 2.0 | 2.0 | Nd | 0.35 | 0 | 0 | 4.5 | 1200 |
| 9 | 0.8 | 2.0 | 2.0 | Nd | 0.35 | 0 | 0 | 10.2 | 1200 |
| 10* | 0.9 | 2.0 | 2.0 | Nd | 0.35 | 0 | 0 | 9.7 | 1200 |
| 11* | 1.0 | 2.0 | 2.0 | Nd | 0.35 | 0 | 0 | 9.2 | 1200 |
| 12* | 0.8 | 2.0 | 2.0 | Nd | 0.4 | 0 | 0 | 8.8 | 1200 |
| 13* | 0.5 | 1.8 | 2.0 | Nd | 0.1 | 0 | 0 | 6.1 | 1200 |
| 14* | 0.8 | 1.8 | 2.0 | Nd | 0.1 | 0 | 0 | 8.2 | 1200 |
| 15 | 0.9 | 1.8 | 2.0 | Nd | 0.1 | 0 | 0 | 13.1 | 1200 |
| 16 | 0.95 | 1.8 | 2.0 | Nd | 0.1 | 0 | 0 | 14.5 | 1200 |
| 17* | 1.0 | 1.8 | 2.0 | Nd | 0.1 | 0 | 0 | 7.8 | 1200 |
| 18* | 0.5 | 1.8 | 2.0 | Nd | 0.35 | 0 | 0 | 6.9 | 1200 |
| 19 | 0.8 | 1.8 | 2.0 | Nd | 0.35 | 0 | 0 | 11.6 | 1200 |
| 20* | 0.9 | 1.8 | 2.0 | Nd | 0.35 | 0 | 0 | 9.5 | 1200 |
| 21* | 1.0 | 1.8 | 2.0 | Nd | 0.35 | 0 | 0 | 9.4 | 1200 |
| 22* | 0.8 | 1.8 | 2.0 | Nd | 0.4 | 0 | 0 | 9.2 | 1200 |
| 23* | 0.95 | 1.75 | 2.0 | Nd | 0.1 | 0 | 0 | 9.0 | 1200 |
| 24 | 0.9 | 2.0 | 2.0 | La | 0.1 | 0 | 0 | 12.7 | 1200 |
| 25 | 0.95 | 2.0 | 2.0 | La | 0.1 | 0 | 0 | 13.3 | 1200 |
| 26 | 0.9 | 1.8 | 2.0 | La | 0.1 | 0 | 0 | 12.9 | 1200 |
| 27 | 0.9 | 2.0 | 2.0 | Y | 0.1 | 0 | 0 | 12.0 | 1200 |
| 28 | 0.95 | 2.0 | 2.0 | Y | 0.1 | 0 | 0 | 13.8 | 1200 |
| 29 | 0.9 | 1.8 | 2.0 | Y | 0.1 | 0 | 0 | 12.1 | 1200 |
| 30 | 0.95 | 2.0 | 2.0 | Nd | 0.1 | 0.1 | 0 | 17.2 | 1200 |
| 31 | 0.95 | 2.0 | 2.0 | Nd | 0.1 | 0.2 | 0 | 16.8 | 1200 |
| 32 | 0.95 | 2.0 | 2.0 | Nd | 0.1 | 0.25 | 0 | 13.8 | 1200 |
| 33 | 0.95 | 2.0 | 2.0 | Nd | 0.1 | 0 | 0.5 | 19.3 | 1200 |
| 34 | 0.95 | 2.0 | 2.0 | Nd | 0.1 | 0 | 1.5 | 18.0 | 1200 |
| 35 | 0.95 | 2.0 | 2.0 | Nd | 0.1 | 0 | 1.6 | 16.0 | 1200 |

Samples marked with the symbol "*" beside their sample numbers represent ones which are outside the scope of the present invention.

The $Q_{max}$-factors shown in Table 1 represent the highest values from the results of the measurement performed under varied conditions (calcining temperature, firing temperature, insulative oil temperature during polarization, and direct voltage). The $Q_{max}$-factor depends on the shape of the sample, the oscillation mode, the type of the electrodes, and the like. In the case of resonators prepared under the conditions in this Example, a $Q_{max}$-factor of 10 or more will suffice for practical use.

As shown in Table 1, all the samples according to the present invention exhibited a $Q_{max}$-factor of 10 or more, and it has been shown that they are piezoelectric ceramic compositions advantageously used for piezoelectric ceramic elements, and particularly for piezoelectric ceramic resonators and the like.

Also, Table 1 shows that the samples according to the present invention each exhibited the highest $Q_{max}$-factor when they were fired at 1200° C., which is lower than a firing temperature of 1250° C. which allowed sample 1, that is, $SrBi_2Nb_2O_9$, to exhibit its highest $Q_{max}$-factor. This suggests that the composition of the present invention brings a secondary effect of reducing firing temperature. Reducing firing temperature leads to reduced energy, such as electric power required for the firing process, and an extended lifetime of a sagger for accommodating a piezoelectric ceramic composition during firing, thus, reducing manufacturing costs.

The piezoelectric ceramic composition of the present invention is not limited to the compositions in the example, and various changes may be made as long as they are within the scope of the invention.

The example has been described with reference to the $Q_{max}$-factor in thickness extensional vibration of circular resonators. However, the effect of the present invention is not limited to this. The composition of the present invention is also advantageous in oscillation modes other than thickness extensional vibration, such as thickness shear vibration and higher harmonics of thickness extensional vibration, used in piezoelectric ceramic elements, and particularly in piezoelectric ceramic resonators and the like.

Figure 2:
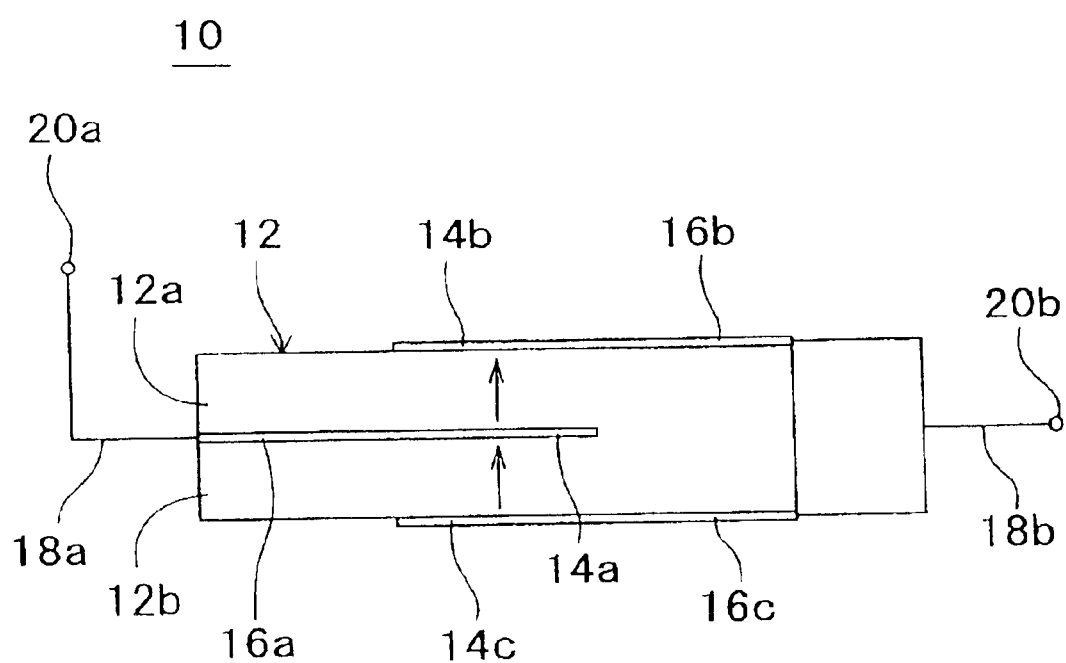
FIG. 2 is a sectional view of the piezoelectric ceramic resonator shown in FIG. 1.

FIG. 1 is a perspective view of a piezoelectric ceramic resonator according to the present invention, and FIG. 2 is a sectional view of the piezoelectric ceramic resonator. The piezoelectric ceramic resonator 10 shown in FIGS. 1 and 2 includes, for example, a rectangular-solid piezoelectric ceramic 12. The piezoelectric ceramic 12 includes two piezoelectric ceramic layers 12a and 12b. These piezoelectric ceramic layers 12a and 12b are formed of the piezoelectric ceramic composition of the present invention, and are laminated together. Also, the piezoelectric ceramic layers 12a and 12b are polarized in an identical direction, as indicated by the arrows shown in FIG. 2.

The piezoelectric ceramic layers 12a and 2b have, for example, a circular first oscillating electrode 14a therebetween, and, for example, a T-shaped first lead-out electrode 16a is extended from the first oscillating electrode 14a to one side of the piezoelectric ceramic 12. The piezoelectric ceramic layer 12a has, for example, a circular second oscillating electrode 14b in the center of the surface thereof, and, for example, a T-shaped second lead-out electrode 16b is extended from the second oscillating electrode 14b to the other side of the piezoelectric ceramic 12. Furthermore, the piezoelectric ceramic layer 12b has, for example, a circular third oscillating electrode 14c in the center of the surface thereof, and, for example, a T-shaped third lead-out electrode 16c is extended from the third oscillating electrode 14c to the same side as in the second lead-out electrode 16b.

The first lead-out electrode 16a is connected to an external electrode 20a via a lead 18a. The second and third lead-out electrodes 16b and 16c are connected to another external electrode 20b via another lead 18b.

The present invention may be applied to other types of piezoelectric ceramic resonators and other piezoelectric ceramic elements, such as piezoelectric oscillators and piezoelectric ceramic filters.

According to the present invention, a piezoelectric ceramic composition mainly containing $SrBi_2Nb_2O_9$ whose bismuth content is equal to or less than the stoichiometric value and substantially does not contain lead and which can be advantageously used for piezoelectric ceramic elements exhibiting a $Q_{max}$-factor sufficient for practical use can be achieved. Also, by using the piezoelectric ceramic composition, a piezoelectric ceramic element exhibiting a $Q_{max}$-factor sufficient for practical use can be achieved.

What is claimed is:

1. A piezoelectric ceramic composition comprising:
    a bismuth layered compound comprising Sr, Bi, Nb, and a metal element other than Bi having a valence of 3, the bismuth layered compound satisfying the relational expressions:
    $0.275 < a/c < 0.5$;
    $0.9 < b/c < 1$;
    $0 < x/c < 0.175$; and
    $0.5 < (a+3x/2)/c < 0.7$,
    wherein a, b, c and x represent the molar fractions of Sr, Bi, Nb and the metal element other than Bi having a valence of 3, respectively.

2. A piezoelectric ceramic composition according to claim 1, wherein the metal element other than Bi having a valence of 3 is at least one selected from the group consisting of Sc, Y, La, Ce, Pr, Nd, Sm, Gd, Dy, Er and Yb.

3. A piezoelectric ceramic composition according to claim 2, wherein the metal element other than Bi having a valence of 3 is Nd.

4. A piezoelectric ceramic composition according to claim 3, further comprising a positive amount less than about 0.25 mol of Ta relative to 1 mol of the Nb contained in the bismuth layered compound.

5. A piezoelectric ceramic composition according to claim 4, further comprising Mn in a positive amount equivalent to about 1.5 percent by weight or less calculated as $MnCO_3$.

6. A piezoelectric ceramic composition according to claim 1, wherein the metal element other than Bi having a valence of 3 is La or Y.

7. A piezoelectric ceramic composition according to claim 6, further comprising a positive amount less than about 0.25 mol of Ta relative to 1 mol of the Nb contained in the bismuth layered compound.

8. A piezoelectric ceramic composition according to claim 7, further comprising Mn in a positive amount equivalent to about 1.5 percent by weight or less calculated as $MnCO_3$.

9. A piezoelectric ceramic composition according to claim 1, further comprising a positive amount less than about 0.25 mol of Ta relative to 1 mol of the Nb contained in the bismuth layered compound.

10. A piezoelectric ceramic composition according to claim 1, further comprising Mn in a positive amount equivalent to about 1.5 percent by weight or less calculated as $MnCO_3$.

11. A piezoelectric ceramic element comprising:
    a piezoelectric ceramic comprising a piezoelectric ceramic composition as set forth in claim 10; and
    an electrode disposed on the piezoelectric ceramic.

12. A piezoelectric ceramic element comprising:
    a piezoelectric ceramic comprising a piezoelectric ceramic composition as set forth in claim 10; and
    an electrode disposed on the piezoelectric ceramic.

13. A piezoelectric ceramic element comprising:
    a piezoelectric ceramic comprising a piezoelectric ceramic composition as set forth in claim 9; and
    an electrode disposed on the piezoelectric ceramic.

14. A piezoelectric ceramic element comprising:
    a piezoelectric ceramic comprising a piezoelectric ceramic composition as set forth in claim 8; and
    an electrode disposed on the piezoelectric ceramic.

15. A piezoelectric ceramic element comprising:
    a piezoelectric ceramic comprising a piezoelectric ceramic composition as set forth in claim 7; and
    an electrode disposed on the piezoelectric ceramic.

16. A piezoelectric ceramic element comprising:
    a piezoelectric ceramic comprising a piezoelectric ceramic composition as set forth in claim 6; and
    an electrode disposed on the piezoelectric ceramic.

17. A piezoelectric ceramic element comprising:
    a piezoelectric ceramic comprising a piezoelectric ceramic composition as set forth in claim 5; and
    an electrode disposed on the piezoelectric ceramic.

18. A piezoelectric ceramic element comprising:
    a piezoelectric ceramic comprising a piezoelectric ceramic composition as set forth in claim 4; and
    an electrode disposed on the piezoelectric ceramic.

19. A piezoelectric ceramic element comprising:
    a piezoelectric ceramic comprising a piezoelectric ceramic composition as set forth in claim 3; and
    an electrode disposed on the piezoelectric ceramic.

20. A piezoelectric ceramic element comprising:
    a piezoelectric ceramic comprising a piezoelectric ceramic composition forth in claim 2; and
    an electrode disposed on the piezoelectric ceramic.

21. A piezoelectric ceramic element comprising:
    a piezoelectric ceramic comprising a piezoelectric ceramic composition forth in claim 1; and
    an electrode disposed on the piezoelectric ceramic.

* * * * *